US011450355B1

(12) United States Patent
Setogawa

(10) Patent No.: US 11,450,355 B1
(45) Date of Patent: Sep. 20, 2022

(54) SEMICONDUCTOR MEMORY WITH TEMPERATURE DEPENDENCE

(71) Applicant: Powerchip Semiconductor Manufacturing Corporation, Hsinchu (TW)

(72) Inventor: Jun Setogawa, Hyougo prefecture (JP)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 17/306,918

(22) Filed: May 3, 2021

(51) Int. Cl.
*G11C 5/14* (2006.01)
*G11C 7/04* (2006.01)

(52) U.S. Cl.
CPC .............. *G11C 5/145* (2013.01); *G11C 5/147* (2013.01); *G11C 7/04* (2013.01)

(58) Field of Classification Search
CPC ............ G11C 5/145; G11C 5/147; G11C 7/04
USPC ...................................... 365/189.09
See application file for complete search history.

(56) References Cited

U.S. PATENT DOCUMENTS

| 8,339,889 | B2 | 12/2012 | Cho | |
|---|---|---|---|---|
| 9,240,224 | B2 | 1/2016 | Mu et al. | |
| 10,325,644 | B1 | 6/2019 | Hsu | |
| 10,559,342 | B2 | 2/2020 | Fujioka et al. | |
| 2004/0041762 | A1* | 3/2004 | Naiki | H02M 3/073 345/87 |
| 2008/0175037 | A1* | 7/2008 | Cheng | G11C 7/065 365/149 |
| 2008/0239802 | A1* | 10/2008 | Thorp | G11C 5/145 365/175 |
| 2010/0246305 | A1* | 9/2010 | Yang | G11C 11/4074 327/536 |
| 2010/0315888 | A1* | 12/2010 | Sato | G11C 7/12 365/189.09 |
| 2015/0023106 | A1* | 1/2015 | He | G11C 16/06 365/185.19 |
| 2019/0051351 | A1* | 2/2019 | Pyo | G11C 11/1673 |
| 2019/0156868 | A1* | 5/2019 | Won | G11C 5/147 |

FOREIGN PATENT DOCUMENTS

| CN | 107919144 | 4/2018 |
|---|---|---|
| TW | I372855 | 9/2012 |
| TW | 201834208 | 9/2018 |
| TW | 201929152 | 7/2019 |

OTHER PUBLICATIONS

"Office Action of Taiwan Counterpart Application", dated Sep. 17, 2021, p. 1-p. 5.

* cited by examiner

*Primary Examiner* — Hoai V Ho
*Assistant Examiner* — Minh Dinh
(74) *Attorney, Agent, or Firm* — JCIPRNET

(57) ABSTRACT

A semiconductor memory with temperature dependence is provided. The semiconductor memory includes a memory array, a temperature sensor circuit and a pump circuit. The temperature sensor circuit is configured to provide a temperature dependent signal. The pump circuit is coupled to the temperature sensor circuit and the memory array. The pump circuit is configured to output a charge-pump output voltage to the memory array according to the temperature dependent signal. The charge-pump output voltage depends on the temperature dependent signal.

18 Claims, 10 Drawing Sheets

SEMICONDUCTOR MEMORY WITH TEMPERATURE DEPENDENCE

BACKGROUND

Technical Field

The disclosure relates to a memory device, and particularly relates to a semiconductor memory with temperature dependence.

Description of Related Art

For general semiconductor memory, the output voltage of the charge pump in the semiconductor memory is constant. On the other hand, the size of recent semiconductor is shrinking, and the design of storage forms is becoming more and more diversified. Hence, the general semiconductor memory may have the situations about a wide range of temperature changes and rapid temperature changes. That is to say, the general semiconductor memory has a problem that it is difficult to optimize the control voltage of the semiconductor memory with temperature changes, and may further adversely affect the memory function. Therefore, regarding how to provide a new type of semiconductor memory with temperature dependence, solutions of several embodiments are provided below.

SUMMARY

The disclosure is directed to a semiconductor memory with temperature dependence, and can follow the change of the temperature to automatically adjust the operating voltage in the memory array.

A semiconductor memory with temperature dependence of the disclosure includes a memory array, a temperature sensor circuit and a pump circuit. The temperature sensor circuit is configured to provide a temperature dependent signal. The pump circuit is coupled to the temperature sensor circuit and the memory array. The pump circuit is configured to output a charge-pump output voltage to the memory array according to the temperature dependent signal. The charge-pump output voltage depends on the temperature dependent signal.

Based on the above, according to the semiconductor memory with temperature dependence of the disclosure, the semiconductor memory can adjust the charge-pump output voltage based on the current temperature of the semiconductor memory, where the charge-pump output voltage can be used as the related internal operating voltages of in the semiconductor memory. Therefore, the semiconductor memory of the disclosure can effectively reduce the temperature influence on the semiconductor memory.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

It is to be understood that other embodiments may be utilized and structural changes may be made without departing from the scope of the disclosure. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "electrically connected," and variations thereof herein are used broadly and encompass direct and indirect connections, couplings, and mountings.

Figure 1:
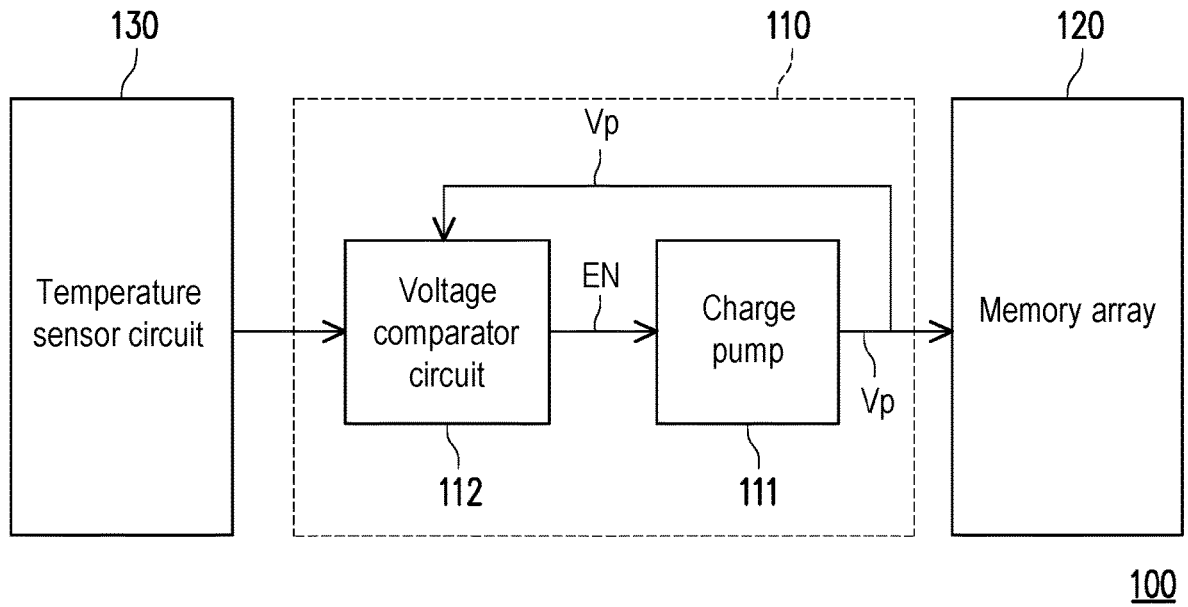
FIG. 1 is a schematic circuit diagram illustrating a semiconductor memory according to an embodiment of the disclosure.

FIG. 1 is a schematic circuit diagram illustrating a semiconductor memory according to an embodiment of the disclosure. Referring to FIG. 1, the semiconductor memory 100 includes a pump circuit 110, a memory array 120 and a temperature sensor circuit 130. The pump circuit 110 is coupled to the memory array 120 and the temperature sensor circuit 130. The pump circuit 110 includes a charge pump 111 and a voltage comparator circuit 112. The charge pump 111 is coupled to the memory array 120. The voltage comparator circuit 112 is coupled to the temperature sensor circuit 130. In the present embodiment of the disclosure, the semiconductor memory 100 may be, for example, a NAND flash memory, a dynamic random access memory (DRAM) or other types of memory. The temperature sensor circuit 130 is disposed in the semiconductor memory 100, and configured to sense the temperature of semiconductor memory 100. The temperature of semiconductor memory 100 may be a circuit core temperature or a circuit board temperature, but the disclosure is not limited thereto. The temperature sensor circuit 130 may output a temperature dependent signal to the voltage comparator circuit 112 according to the temperature of semiconductor memory 100.

In the present embodiment of the disclosure, the voltage comparator circuit 112 may output a pump activation signal EN to the charge pump 111 according to a reference voltage and a feedback voltage corresponding to a charge-pump output voltage Vp. The charge-pump output voltage depends on the temperature dependent signal. The charge pump 111 outputs the charge-pump output voltage Vp to the memory array 120 according to the pump activation signal EN. Specifically, the pump activation signal EN may be a high voltage level or a low voltage level according to the comparison result of the voltage comparator circuit 112. If the charge pump 111 is a positive voltage charge pump and the pump activation signal EN is the high voltage level, the charge pump 111 is be active to boost the voltage level of the charge-pump output voltage Vp until the pump activation signal EN changes to the low voltage level. If the charge pump 111 is a negative voltage charge pump and the pump activation signal EN is the high voltage level, the charge pump 111 is be active to reduce the voltage level of the charge-pump output voltage Vp until the pump activation signal EN changes to the low voltage level. In the present embodiment of the disclosure, the charge-pump output voltage Vp may be an operating voltage for an internal circuit of the memory array 120. In other words, the charge pump 111 and the voltage comparator circuit 112 form a feedback circuit. In the present embodiment of the disclosure, the reference voltage or the feedback voltage depends on the temperature dependent signal, and the charge-pump output voltage Vp depends on the temperature dependent signal.

Figure 2:
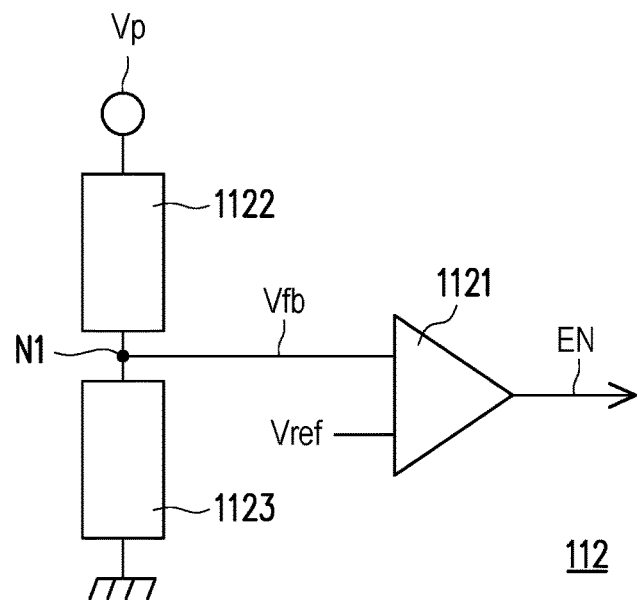
FIG. 2 is a schematic circuit diagram illustrating a voltage comparator circuit according to an embodiment of the disclosure.

FIG. 2 is a schematic circuit diagram illustrating a voltage comparator circuit according to an embodiment of the disclosure. Referring to FIG. 1 and FIG. 2, in the present embodiment of the disclosure, the voltage comparator circuit 112 may include a comparator 1121, a resistor 1122 and resistor 1123. A first terminal of the resistor 1122 is coupled to the charge-pump output voltage Vp, and a second terminal of the resistor 1122 is coupled to a circuit node N1. A first terminal of the resistor 1123 is coupled to the circuit node N1, and a second terminal of the resistor 1123 is coupled to a ground voltage. A first input terminal of the comparator 1121 is coupled to the circuit node N1 to receive the feedback voltage Vfb. A second input terminal of the comparator 1121 receives the reference voltage Vref. An output terminal of the comparator 1121 outputs the pump activation signal EN. It should be noted that, referring to FIG. 2 and FIG. 3, the semiconductor memory 100 may change one of the feedback voltage Vfb and the reference voltage Vref to correspondingly change the pump target voltage.

Figure 3:
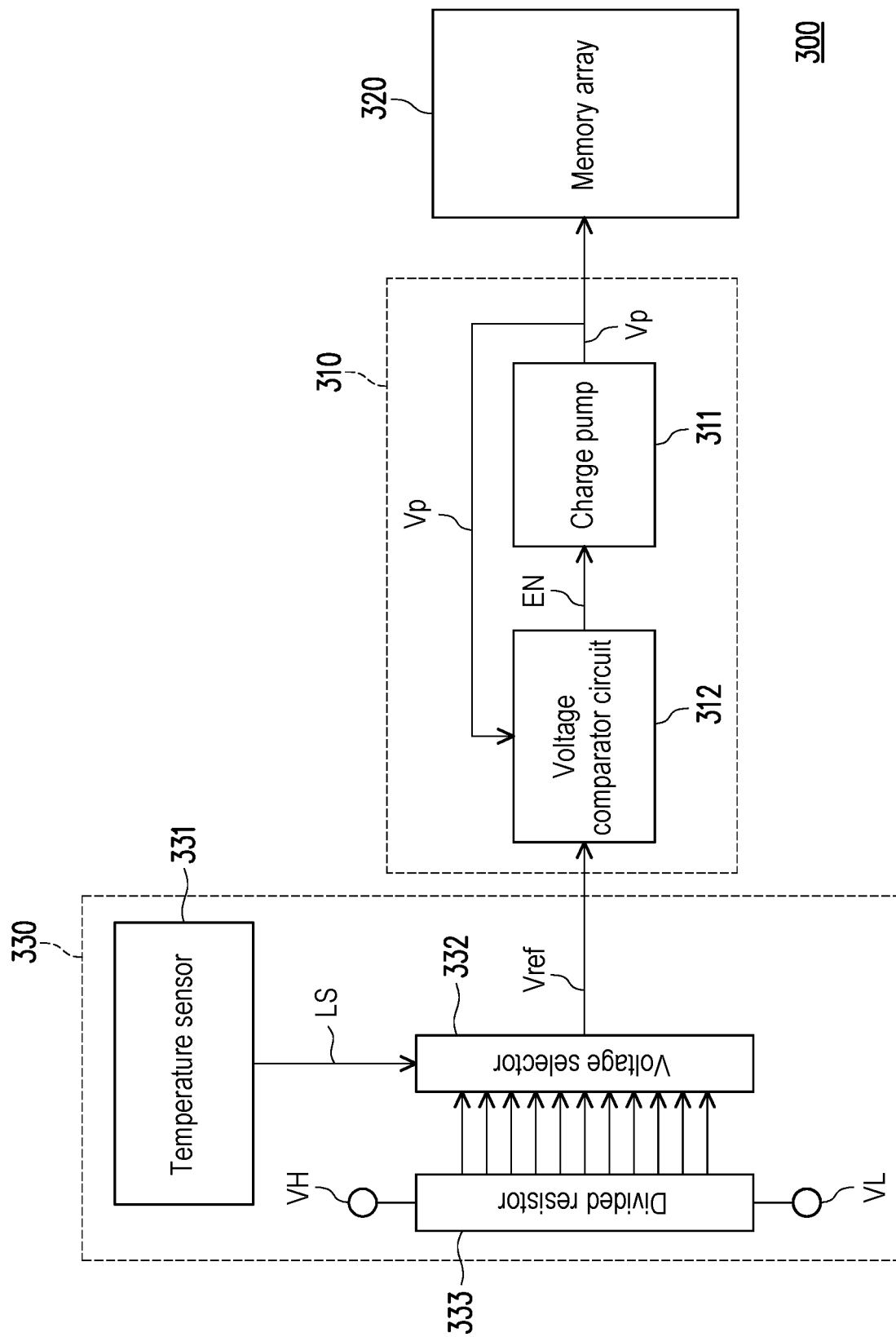
FIG. 3 is a schematic circuit diagram illustrating a semiconductor memory according to a first embodiment of the disclosure.
Figure 4:
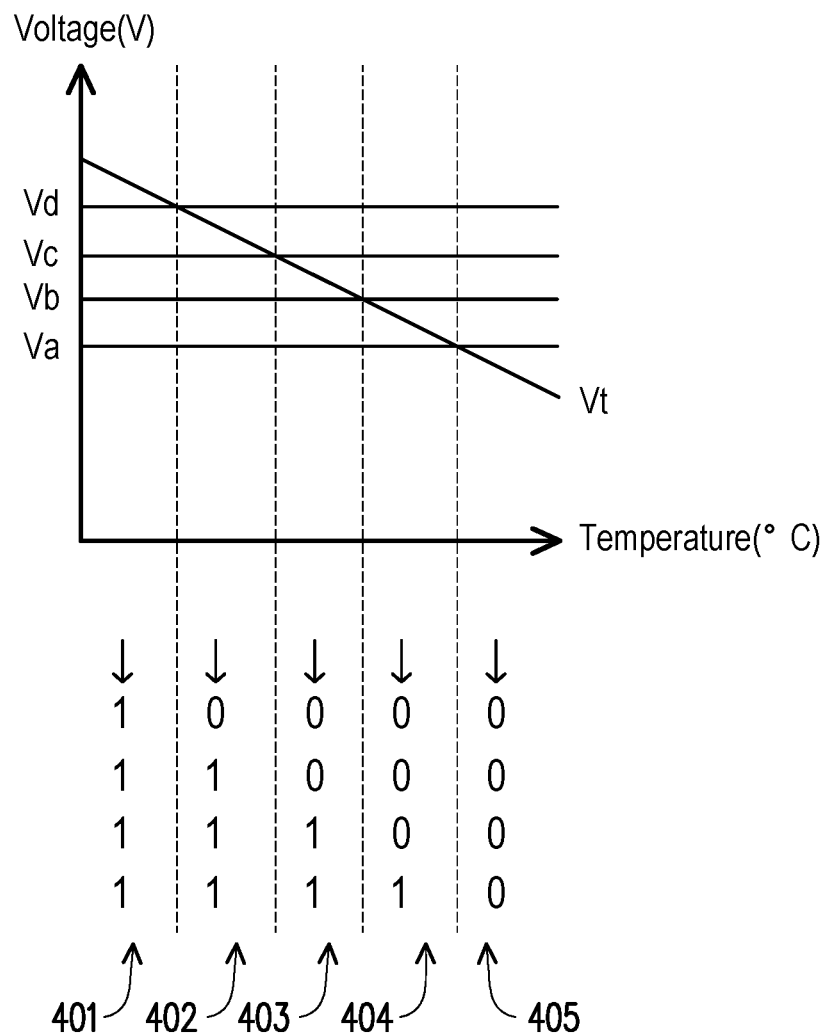
FIG. 4 is a schematic diagram illustrating the relationship between the logic signal and the temperature according to an embodiment of the disclosure.

FIG. 3 is a schematic circuit diagram illustrating a semiconductor memory according to a first embodiment of the disclosure. FIG. 4 is a schematic diagram illustrating the relationship between the logic signal and the temperature according to an embodiment of the disclosure. Referring to FIG. 3, the semiconductor memory 300 includes a pump circuit 310, a memory array 320 and a temperature sensor circuit 330. The pump circuit 310 is coupled to the memory array 320 and the temperature sensor circuit 330. The pump circuit 310 includes a charge pump 311 and a voltage comparator circuit 312. The charge pump 311 is coupled to the memory array 320. The voltage comparator circuit 312 is coupled to the temperature sensor circuit 330. It should be noted that the voltage comparator circuit 312 may include same circuit units as the voltage comparator circuit 112 of the embodiment of FIG. 2.

In the present embodiment of the disclosure, the temperature sensor circuit 330 includes a temperature sensor 331, a voltage selector 332 and a divided resistor 333. The temperature sensor 331 may sense the temperature of the semiconductor memory 300, and to output a logic signal LS. The voltage selector 332 is coupled to the temperature sensor 331 and the second input terminal of the comparator of the voltage comparator circuit 312. The voltage selector 332 may receive the logic signal LS. The divided resistor 333 is coupled to the voltage selector 332. The divided resistor 333 may generate a plurality of divided voltages to the voltage selector 332 according to a high voltage level VH and a low voltage level VL. In the present embodiment of the disclosure, the voltage selector 332 may generate the reference voltage Vref as the temperature dependent signal to the second input terminal of the comparator of the voltage comparator circuit 312 according to the plurality of divided voltages and the logic signal LS.

Referring to FIG. 3 and FIG. 4, the temperature sensor 331 may generate a temperature sensing voltage Vt according to the temperature sensing result. In the present embodiment of the disclosure, the temperature sensor 331 may be a negative temperature coefficient (NTC) sensor, thus the temperature sensing voltage Vt is negatively related with the temperature sensed by the temperature sensor 331. The temperature sensor 331 may preset a plurality of threshold voltages Va, Vb, Vc and Vd, and the threshold voltages Va, Vb, Vc and Vd may respectively correspond to a plurality of temperature values Ta1, Ta2, Ta3 and Ta4. The temperature sensor 331 may compare the temperature sensing voltage Vt with the threshold voltages Va, Vb, Vc and Vd to determine that the temperature sensing voltage Vt is locate between two of the threshold voltages Va, Vb, Vc and Vd to output the logic signal LS with a specific logic code sequence.

For example, when the temperature sensor 331 determines that the temperature sensing voltage Vt is higher than the voltage threshold value Vd (indicating that the current temperature of the semiconductor memory 300 is lower than the temperature value Ta1), and the temperature sensor 331 may output the logic signal LS having a logic code sequence code 401, where the logic code sequence 401 may be "1111". When the temperature sensor 331 determines that the temperature sensing voltage Vt is between the voltage threshold value Vd and the voltage threshold value Vc (indicating that the current temperature of the semiconductor memory 300 is between the temperature value Ta1 and the temperature value Ta2), and the temperature sensor 331 may output the logic signal LS having a logic code sequence code 402, where the logic code sequence 402 may be "0111". When the temperature sensor 331 determines that the temperature sensing voltage Vt is between the voltage threshold value Vc and the voltage threshold value Vb (indicating that the current temperature of the semiconductor memory 300 is between the temperature value Ta2 and the temperature value Ta3), and the temperature sensor 331 may output the logic signal LS having a logic code sequence code 403, where the logic code sequence 403 may be "0011". When the temperature sensor 331 determines that the temperature sensing voltage Vt is between the voltage threshold value Vb and the voltage threshold value Va (indicating that the current temperature of the semiconductor memory 300 is between the temperature value Ta3 and the temperature value Ta4), and the temperature sensor 331 may output the logic signal LS having a logic code sequence code 404, where the logic code sequence 404 may be "0001". When the temperature sensor 331 determines that the temperature sensing voltage Vt is lower the voltage threshold value Va (indicating that the current temperature of the semiconductor memory 300 is higher than the temperature value Ta4), and the temperature sensor 331 may output the logic signal LS having a logic code sequence code 405, where the logic code sequence 404 may be "0000".

In the present embodiment of the disclosure, the temperature sensor 331 may output the logic signal LS with a specific logic code sequence depends on the temperature of the semiconductor memory 300, so that the voltage selector 332 may output the corresponding reference voltage Vref to the second input terminal of the comparator of the voltage comparator circuit 312. Thus, the voltage comparator circuit 312 may output the pump activation signal EN according to the change of the temperature of the semiconductor memory 300, and the charge-pump output voltage Vp changes with the temperature of the semiconductor memory 300. Therefore, the semiconductor memory 300 of the embodiment may have an automatic adjust function of operating voltage based on the change of the temperature. The semiconductor memory 300 may change the pump target voltage by changing the reference voltage Vref.

Figure 5:
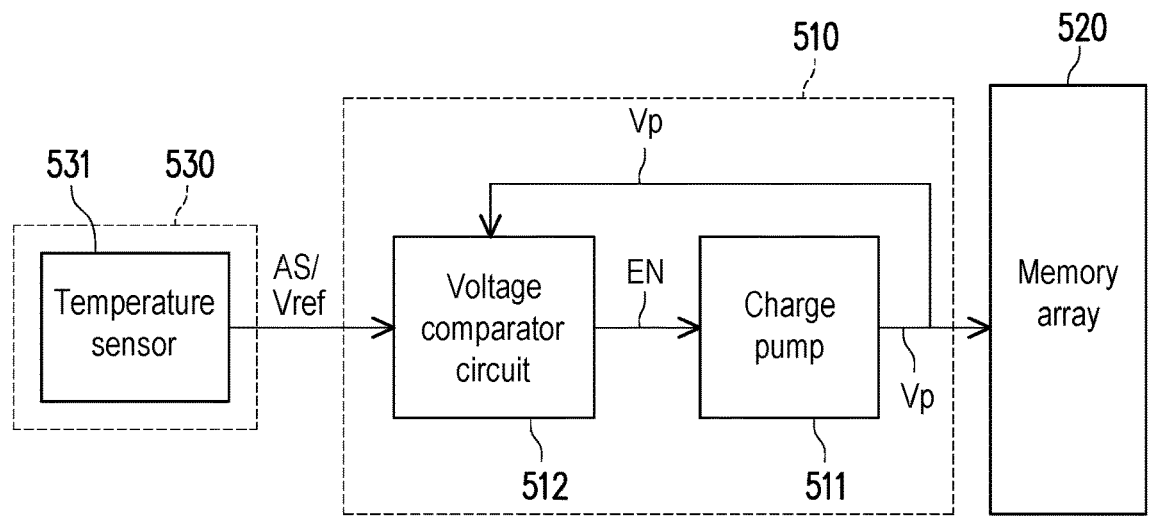
FIG. 5 is a schematic circuit diagram illustrating a semiconductor memory according to a second embodiment of the disclosure.
Figure 6:
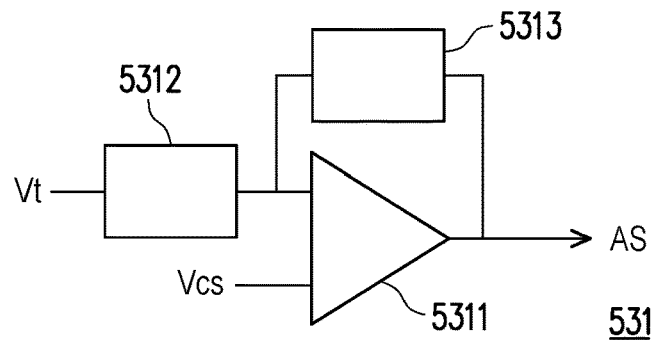
FIG. 6 is a schematic circuit diagram illustrating an internal circuit of the temperature sensor according to an embodiment of the disclosure.
Figure 7:
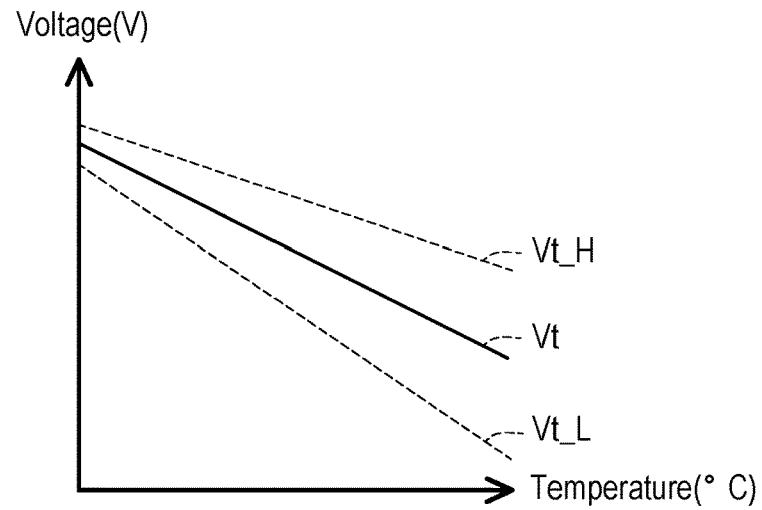
FIG. 7 is a schematic diagram illustrating the relationship between temperature sensing voltage and the temperature according to an embodiment of the disclosure.

FIG. 5 is a schematic circuit diagram illustrating a semiconductor memory according to a second embodiment of the disclosure. FIG. 6 is a schematic circuit diagram illustrating an internal circuit of the temperature sensor according to an embodiment of the disclosure. FIG. 7 is a schematic diagram illustrating the relationship between temperature sensing voltage and the temperature according to an embodiment of the disclosure. Referring to FIG. 5, the semiconductor memory 500 includes a pump circuit 510, a memory array 520 and a temperature sensor circuit 530. The pump circuit 510 is coupled to the memory array 520 and the temperature sensor circuit 530. The pump circuit 510 includes a charge pump 511 and a voltage comparator circuit 512. The charge pump 511 is coupled to the memory array 520. The voltage comparator circuit 512 is coupled to the temperature sensor circuit 530. It should be noted that the voltage comparator circuit 512 may include same circuit units as the voltage comparator circuit 112 of the embodiment of FIG. 2. Temperature sensor circuit 530 includes a temperature sensor 531, and the temperature sensor 531 is coupled to the second input terminal of the comparator of the voltage comparator circuit 512. The temperature sensor 531 may provide an analog signal AS to the voltage comparator circuit 512 as the reference voltage.

Referring to FIG. 6, the temperature sensor 531 may include a comparator 5311, a resistor 5312 and a resistor 5313. In the present embodiment of the disclosure, a first input terminal of the comparator 5311 is coupled to a constant voltage Vcs. A first terminal of the resistor 5312 is coupled to the temperature sensing voltage Vt. A second terminal of the resistor 5312 is coupled to a second input terminal of the comparator 5311. A first terminal of the resistor 5313 is coupled to the second input terminal of the comparator 5311, and a second terminal of the resistor 5313 is coupled to an output terminal of the comparator 5311. The output terminal of the comparator 5311 outputs the analog signal AS to the second input terminal of the comparator of the voltage comparator circuit 512 as the reference voltage.

Referring to FIG. 5 to FIG. 7, the temperature sensor 331 may generate a temperature sensing voltage Vt according to the temperature sensing result. In the present embodiment of the disclosure, the temperature sensor 531 may be the negative temperature coefficient sensor, thus the temperature sensing voltage Vt is negatively related with the temperature sensed by the temperature sensor 531. Based on the above circuit of the temperature sensor 531, the temperature sensor may output the analog signal AS, and the analog signal AS depends on the temperature of the semiconductor memory 300 sensed by the temperature sensor 531. In the present embodiment of the disclosure, the resistance ratio of the resistor 5312 and the resistor 5313 can be adjusted to change the slope of the voltage change of the analog signal AS. The voltage change of the analog signal AS may be, for example, an oblique line Vt_H or an oblique line Vt_L as shown in FIG. 7. Thus, the voltage comparator circuit 512 may output the pump activation signal EN according to the change of the temperature of the semiconductor memory 500, so that the charge-pump output voltage Vp changes with the temperature of the semiconductor memory 500. Therefore, the semiconductor memory 500 of the embodiment may have an automatic adjust function of operating voltage based on the change of the temperature. The semiconductor memory 500 may change the pump target voltage by changing the reference voltage (i.e., changing the analog signal AS).

Figure 8:
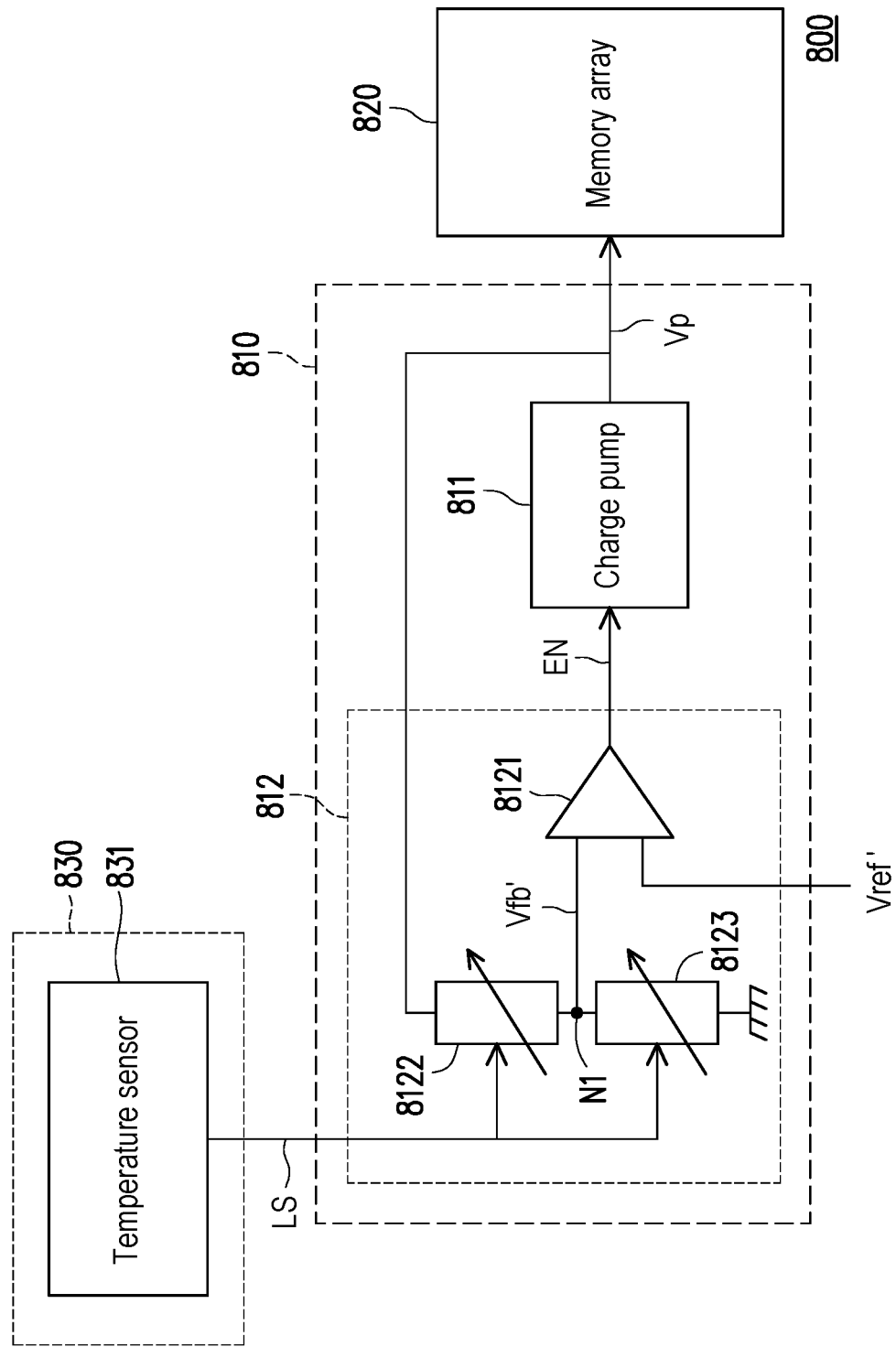
FIG. 8 is a schematic circuit diagram illustrating a semiconductor memory according to a third embodiment of the disclosure.

FIG. 8 is a schematic circuit diagram illustrating a semiconductor memory according to a third embodiment of the disclosure. Referring to FIG. 8, the semiconductor memory 800 includes a pump circuit 810, a memory array 820 and a temperature sensor circuit 830. The pump circuit 810 is coupled to the memory array 820 and the temperature sensor circuit 830. The pump circuit 810 includes a charge pump 811 and a voltage comparator circuit 812. The charge pump 811 is coupled to the memory array 820. The voltage comparator circuit 812 is coupled to the temperature sensor circuit 830. The temperature sensor circuit 830 includes a temperature sensor 831, and the temperature sensor 831 may output the logic signal LS. It should be noted that the temperature sensor 831 may include same circuit units and same signal generation mechanism as the temperature sensor 331 of the embodiment of FIG. 3.

In the present embodiment of the disclosure, the voltage comparator circuit 812 includes a comparator 8121, a resistor 8122 and resistor 8123. A first terminal of the resistor 8122 is coupled to the charge-pump output voltage Vp, and a second terminal of the resistor 8122 is coupled to a circuit node N1. A first terminal of the resistor 8123 is coupled to the circuit node N1, and a second terminal of the resistor 8123 is coupled to a ground voltage. A first input terminal of the comparator 8121 is coupled to the circuit node N1 to receive the feedback voltage Vfb'. A second input terminal of the comparator 8121 receives the reference voltage Vref'. An output terminal of the comparator 8121 outputs the pump activation signal EN. In the present embodiment of the disclosure, the resistor 8122 and the resistor 8123 are variable resistor. The temperature sensor 831 may output the logic signal LS depends on the temperature of the semiconductor memory 800, and the voltage comparator circuit 812 may adjust at least one of the resistances of the resistor 8122 and the resistor 8123 according to the logic signal LS, so as to correspondingly adjust the feedback voltage Vfb'. The comparator 8121 outputs the pump activation signal EN according to the comparing result of the feedback voltage VW and the reference voltage Vref'. The feedback voltage Vfb' depends on the temperature sensed by the temperature sensor 831, and the reference voltage Vref' may be a constant voltage, so that the charge-pump output voltage Vp also changes with the temperature of the semiconductor memory 800. Therefore, the semiconductor memory 800 of the embodiment may have an automatic adjust function of operating voltage based on the change of the temperature. The semiconductor memory 800 may change the pump target voltage by changing the feedback voltage Vfb'.

Figure 9:
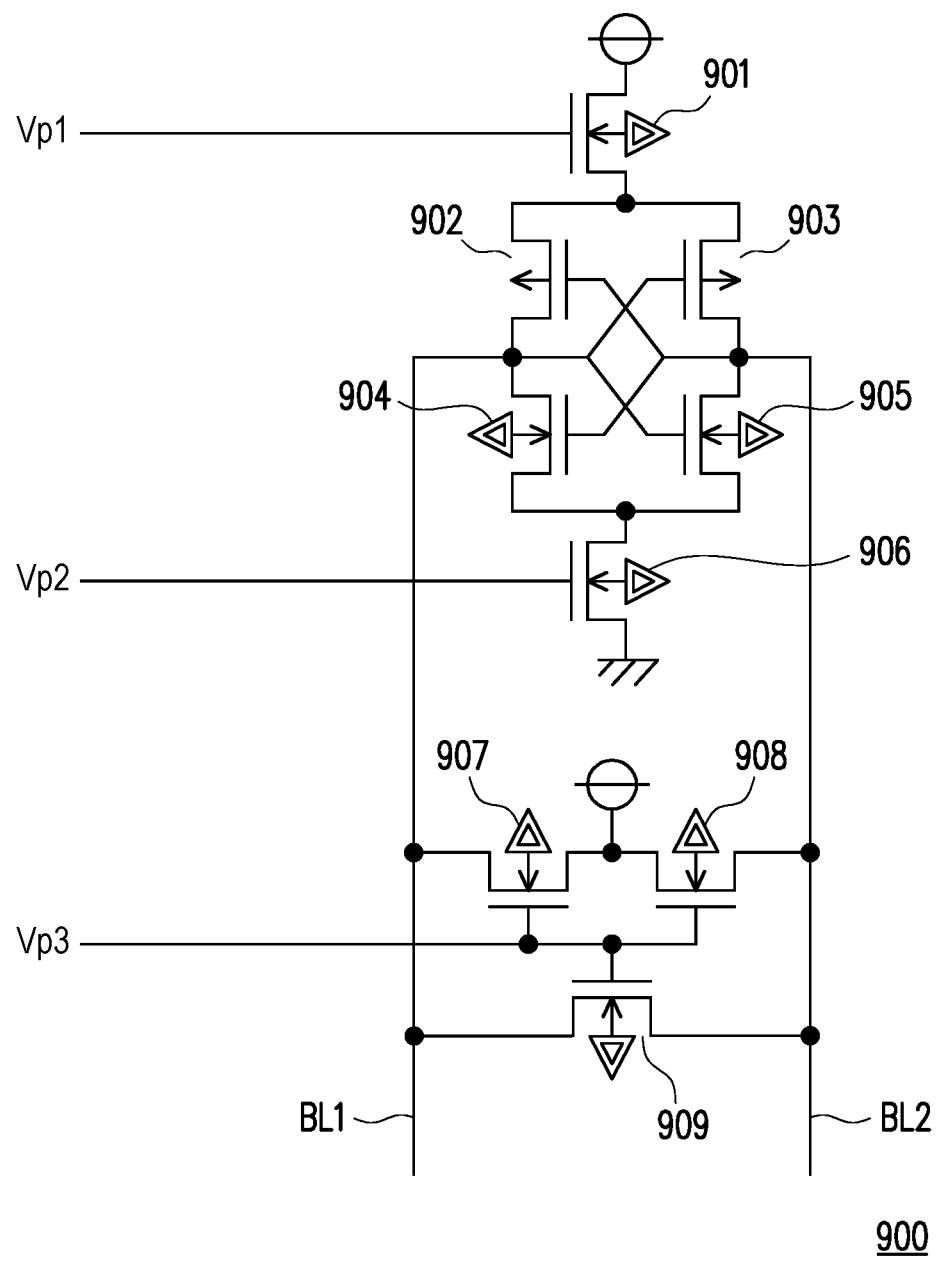
FIG. 9 is a schematic circuit diagram illustrating a sense amplifier control circuit and an equalize control circuit of the semiconductor memory according to an embodiment of the disclosure.

FIG. 9 is a schematic circuit diagram illustrating a sense amplifier control circuit and an equalize control circuit of the semiconductor memory according to an embodiment of the disclosure. Referring to FIG. 9, the control circuit 900 includes a plurality of transistors 901 to 909. In the present embodiment of the disclosure, a first terminal of the transistor 901 is coupled to a voltage source, and a control terminal of the transistor 901 receives a control signal voltage Vp1. A first terminal of the transistor 902 is coupled to a second terminal of the transistor 901. A first terminal of the transistor 903 is coupled to a second terminal of the transistor 901. A first terminal of the transistor 904 is coupled to a second terminal of the transistor 902 and a bit line BL1. A first terminal of the transistor 905 is coupled to a second terminal of the transistor 903 and a bit line BL2. A control terminal of the transistor 902 is coupled to a control terminal of the transistor 905. A control terminal of the transistor 903 is coupled to a control terminal of the transistor 904. A first terminal of the transistor 906 is coupled to a second terminals of the transistor 904 and the transistor 905. A second terminal of the transistor 906 is coupled to a ground voltage. A control terminal of the transistor 906 is coupled to a control signal voltage Vp2. In the present embodiment of the disclosure, the transistors 901 to 906 are configured to be the sense amplifier of the memory array.

In the present embodiment of the disclosure, a first terminal of the transistor 907 is coupled to the bit line BL1, and a second terminal of the transistor 907 is coupled to the voltage source. A first terminal of the transistor 908 is coupled to the bit line BL2, and a second terminal of the transistor 908 is coupled to the voltage source. A control terminal of the transistor 907 and a control terminal of the transistor 908 are coupled to an equalize voltage Vp3. A first terminal of the transistor 909 is coupled to the bit line BL1, and a second terminal of the transistor 909 is coupled to the bit line BL2. A control terminal of the transistor 909 is coupled to the equalize voltage Vp3. In the present embodiment of the disclosure, the transistors 907 to 909 are configured to be the equalize control circuit.

In the present embodiment of the disclosure, the charge-pump output voltage Vp of at least one of the above embodiments of FIG. 1, FIG. 3, FIG. 5 and FIG. 8 may be outputted to the memory array as a memory control voltage. For example, referring to FIG. 9, the charge-pump output voltage Vp of at least one of the above embodiments of FIG. 1, FIG. 3, FIG. 5 and FIG. 8 may be outputted to the sense amplifier of the memory array as at least one of the control signal voltage Vp1, the control signal voltage Vp2 and the equalize voltage Vp3. Alternatively, the charge-pump output voltage Vp of at least one of the above embodiments of FIG. 1, FIG. 3, FIG. 5 and FIG. 8 may be outputted to the sense amplifier of the memory array as the back bias voltage of at least one of the transistors 901, 904 to 906. Alternatively, the charge-pump output voltage Vp of at least one of the above embodiments of FIG. 1, FIG. 3, FIG. 5 and FIG. 8 may be outputted to the equalize control circuit of the memory array as the back bias voltage of at least one of the transistors 907 to 909. Therefore, the temperature influence on at least one of the sense amplifier or the equalize control circuit can be effectively reduced.

Figure 10B:
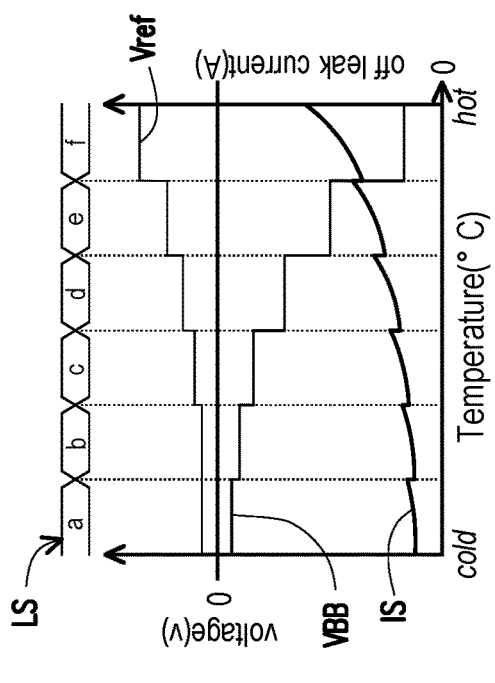
FIG. 10B to FIG. 10D are schematic diagrams illustrating the change of multiple operating voltages with temperature according to embodiment of FIG. 9 of the disclosure.
Figure 10D:
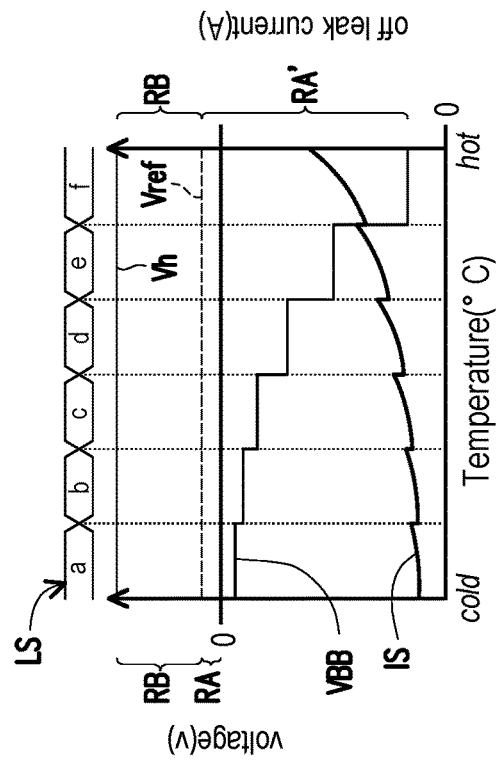
Figure 10A:
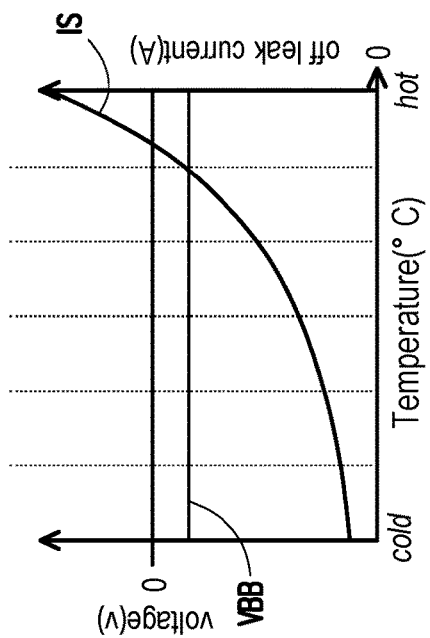
FIG. 10A is a schematic diagram illustrating the change of multiple operating voltages of the sense amplifier control circuit and the equalize control circuit with temperature.

FIG. 10A is a schematic diagram illustrating the change of multiple operating voltages of the sense amplifier control circuit and the equalize control circuit with temperature. Referring to FIG. 9 and FIG. 10A, if the back bias voltage VBB of one of the transistors 901, 904, 906 to 909 is a fixed voltage (independent of temperature), the off leak current IS of the corresponding transistor may increase following the temperature.

Figure 10C:
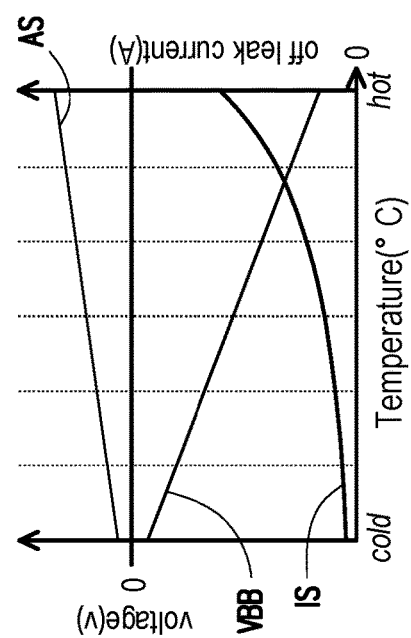

FIG. 10B to FIG. 10D are schematic diagrams illustrating the change of multiple operating voltages with temperature according to embodiment of FIG. 9 of the disclosure. Referring to FIG. 3, FIG. 9 and FIG. 10B, when the charge-pump output voltage Vp of the above embodiment of FIG. 3 may be outputted to the sense amplifier of the memory array as the back bias voltage VBB (depends on temperature) of one of the transistors 901, 904, 906 to 909. The back bias voltage VBB (i.e., changing the charge-pump output voltage Vp) changes according to the logic signal LS, so that the back bias voltage VBB may decrease with temperature raising. Therefore, the semiconductor memory 300 of FIG. 3 may change the back bias voltage VBB by changing the reference voltage Vref, so that the off leak current IS of the corresponding transistor (standby current of transistor) may be effectively suppressed.

Referring to FIG. 5, FIG. 9 and FIG. 10C, when the charge-pump output voltage Vp of the above embodiment of FIG. 5 may be outputted to the sense amplifier of the memory array as the back bias voltage VBB (depends on temperature) of one of the transistors 901, 904, 906 to 909. The back bias voltage VBB (i.e., changing the charge-pump output voltage Vp) changes according to the analog signal AS (as reference voltage), so that the back bias voltage VBB may decrease with temperature raising. Therefore, the semiconductor memory 500 of FIG. 5 may change the back bias voltage VBB by changing the analog signal AS (as reference voltage), so that the off leak current IS of the corresponding transistor (standby current of transistor) may be effectively suppressed.

Referring to FIG. 8, FIG. 9 and FIG. 10D, when the charge-pump output voltage Vp of the above embodiment of FIG. 8 may be outputted to the sense amplifier of the memory array as the back bias voltage VBB (depends on temperature) of one of the transistors 901, 904, 906 to 909. The back bias voltage VBB (i.e., changing the charge-pump output voltage Vp) changes according to the logic signal LS, so that the back bias voltage VBB may decrease with temperature raising. Specifically, the logic signal LS may change the resistance RA of the resistor 8122 of FIG. 8, but the resistance RB of the resistor 8123 of FIG. 8 is fixed, so as to correspondingly change the resistance ratio of the resistor 8122 and the resistor 8123 of FIG. 8. Then, the feedback voltage Vfb' changes according to the resistance ratio. Therefore, the semiconductor memory 800 of FIG. 8 may change the back bias voltage VBB by changing the feedback voltage Vfb', so that the off leak current IS of the corresponding transistor (standby current of transistor) may be effectively suppressed.

Figure 11:
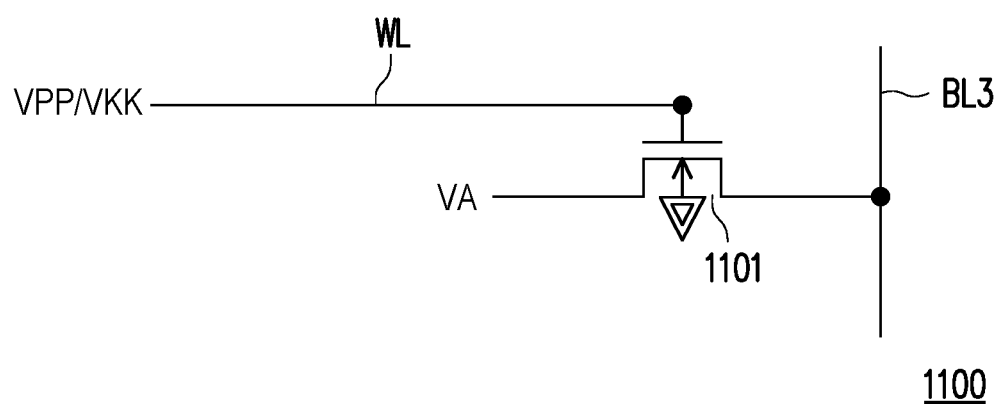
FIG. 11 is a schematic circuit diagram illustrating the word line circuit of the memory cell according to an embodiment of the disclosure.

FIG. 11 is a schematic circuit diagram illustrating the word line circuit of the memory cell according to an embodiment of the disclosure. Referring to FIG. 11, the memory cell includes the word line circuit 1100, and the word line circuit 1100 includes a transistor 1101. In the present embodiment of the disclosure, a first terminal of the transistor 1101 is coupled to a reference voltage VA, and a second terminal of the transistor 1101 is coupled to a bit line BL3. A control terminal of the transistor 1101 is coupled to a word line WL, and receives a word line voltage through the word line WL. The word line voltage may be a programming voltage VPP or a reset voltage VKK.

For example, the charge-pump output voltage Vp of at least one of the above embodiments of FIG. 1, FIG. 3, FIG. 5 and FIG. 8 may be outputted to the memory cell of the memory array as the programming voltage VPP or the reset voltage VKK. Alternatively, the charge-pump output voltage Vp of at least one of the above embodiments of FIG. 1, FIG. 3, FIG. 5 and FIG. 8 may be outputted to the memory cell of the memory array as the back bias voltage of the transistor 1101 coupled to the word line WL. Therefore, the temperature influence on the word line circuit 1100 can be effectively reduced.

Figure 12A:
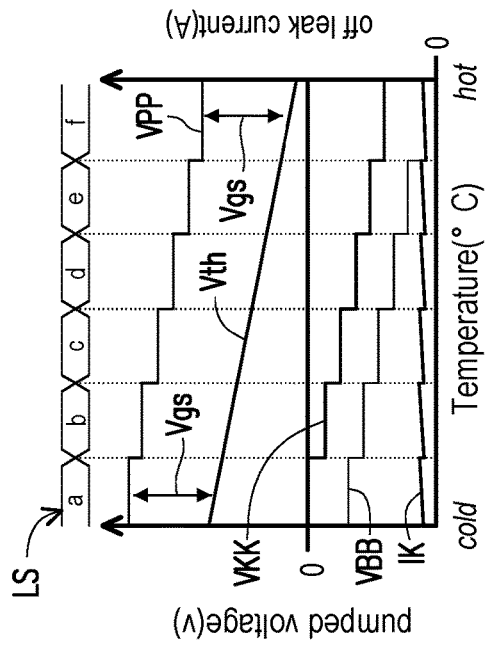
FIG. 12A is a schematic diagram illustrating the change of multiple operating voltages of the transfer gate circuit of the data bus with temperature.

FIG. 12A is a schematic diagram illustrating the change of multiple operating voltages of the transfer gate circuit of the data bus with temperature. Referring to FIG. 11 and FIG. 12A, if the programming voltage VPP, the reset voltage VKK or the back bias voltage VBB for the transistor 1101 is a fixed voltage (independent of temperature), the off leak current IK of the transistor 1101 may increase following the temperature.

Figure 12C:
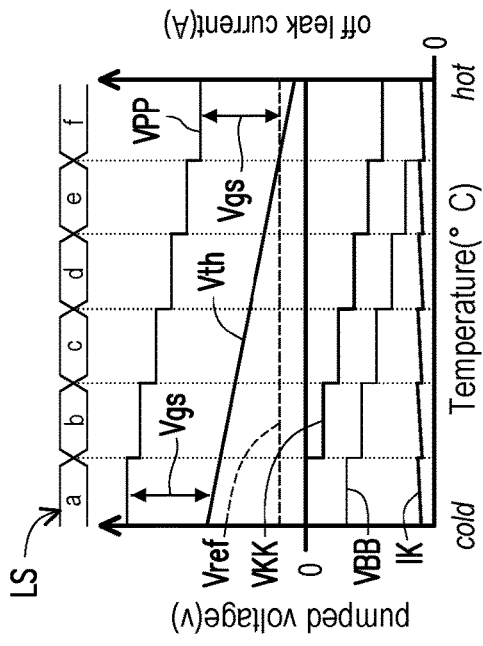
FIG. 12B to FIG. 12D are schematic diagrams illustrating the change of multiple operating voltages with temperature according to embodiment of FIG. 11 of the disclosure.
Figure 12B:
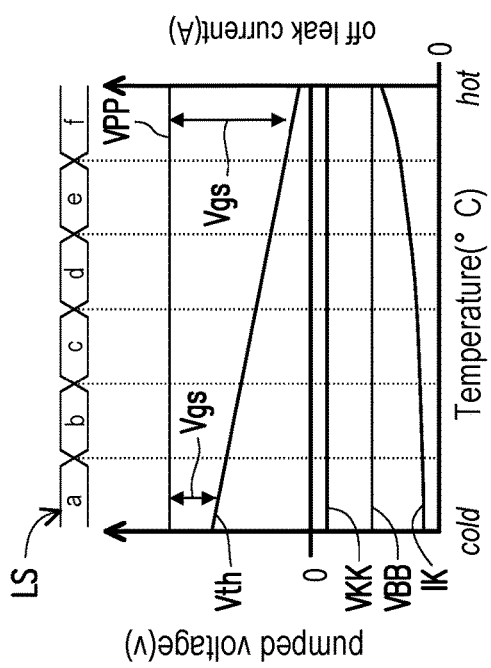
Figure 12D:
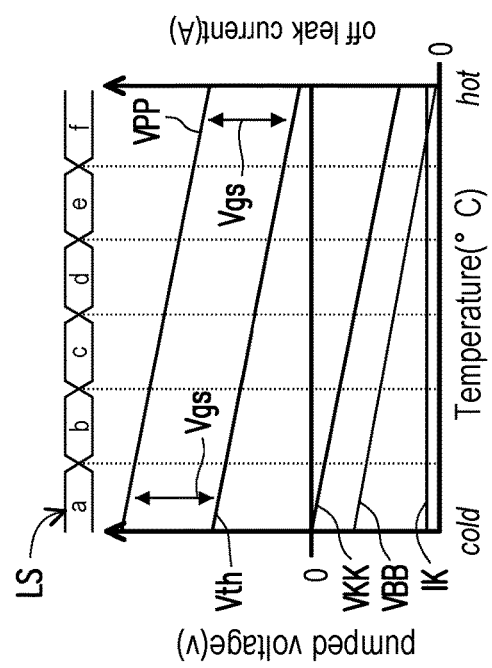

FIG. 12B to FIG. 12D are schematic diagrams illustrating the change of multiple operating voltages with temperature according to embodiment of FIG. 11 of the disclosure. Referring to FIG. 3, FIG. 11 and FIG. 12B, when the charge-pump output voltage Vp of the above embodiment of FIG. 3 may be outputted to the memory cell of the memory array as the programming voltage VPP, the reset voltage VKK or the back bias voltage VBB (depends on temperature) of the transistor 1101. The programming voltage VPP, the reset voltage VKK or the back bias voltage VBB (i.e., changing the charge-pump output voltage Vp) changes according to the logic signal LS, and the voltage Vgs of the transistor 1101 may be maintained in a specific voltage, so that the programming voltage VPP, the reset voltage VKK or the back bias voltage VBB may decrease with temperature raising. Therefore, the semiconductor memory 300 of FIG. 3 may change the programming voltage VPP, the reset voltage VKK or the back bias voltage VBB by changing the reference voltage Vref, so that the off leak current IK of the transistor 1101 may be effectively suppressed.

Referring to FIG. 5, FIG. 11 and FIG. 12C, when the charge-pump output voltage Vp of the above embodiment of FIG. 5 may be outputted to the memory cell of the memory array as the programming voltage VPP, the reset voltage VKK or the back bias voltage VBB (depends on temperature) of the transistor 1101. The programming voltage VPP, the reset voltage VKK or the back bias voltage VBB (i.e., changing the charge-pump output voltage Vp) changes according to the analog signal AS (as reference voltage), so that the programming voltage VPP, the reset voltage VKK or the back bias voltage VBB may decrease with temperature raising. Therefore, the semiconductor memory 500 of FIG. 5 may change the programming voltage VPP, the reset voltage VKK or the back bias voltage VBB by changing the analog signal AS (as reference voltage), so that the off leak current IK of the transistors 1101 may be effectively suppressed.

Referring to FIG. 8, FIG. 11 and FIG. 12D, when the charge-pump output voltage Vp of the above embodiment of FIG. 8 may be outputted to the memory cell of the memory array as the programming voltage VPP, the reset voltage VKK or the back bias voltage VBB (depends on temperature) of the transistors 1101. The programming voltage VPP, the reset voltage VKK or the back bias voltage VBB (i.e., changing the charge-pump output voltage Vp) changes according to the logic signal LS, so that the programming voltage VPP, the reset voltage VKK or the back bias voltage VBB may decrease with temperature raising. Specifically, the logic signal LS may change the resistance RA of the resistor 8122 of FIG. 8 (the resistance RB of the resistor 8123 of FIG. 8 is fixed), so as to correspondingly change the resistance ratio of the resistor 8122 and the resistor 8123 of FIG. 8. Then, the feedback voltage Vfb' changes according to the resistance ratio. Therefore, the semiconductor memory 800 of FIG. 8 may change the programming voltage VPP, the reset voltage VKK or the back bias voltage VBB by changing the feedback voltage Vfb', so that the off leak current IK of the transistors 1101 may be effectively suppressed.

Figure 13:
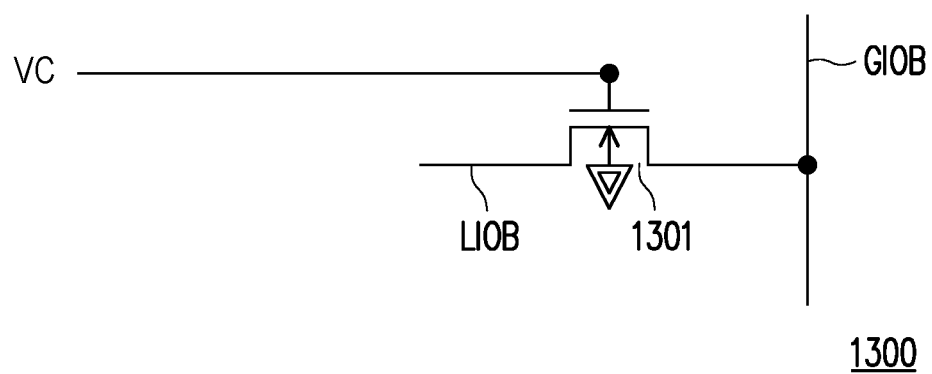
FIG. 13 is a schematic circuit diagram illustrating the transfer gate circuit of the data bus according to an embodiment of the disclosure.

FIG. 13 is a schematic circuit diagram illustrating the transfer gate circuit of the data bus according to an embodiment of the disclosure. Referring to FIG. 13, the transfer gate circuit 1300 includes a transistor 1301. In the present embodiment of the disclosure, a first terminal of the transistor 1301 is coupled to a local input/output bus LIOB, and a second terminal of the transistor 1301 is coupled to a global input/output bus GIOB. A control terminal of the transistor 1301 is coupled to a transfer voltage VC. For example, the charge-pump output voltage Vp of at least one of the above embodiments of FIG. 1, FIG. 3, FIG. 5 and FIG. 8 may be outputted to the transfer gate circuit 1300 as the transfer voltage VC. Alternatively, the charge-pump output voltage Vp of at least one of the above embodiments of FIG. 1, FIG. 3, FIG. 5 and FIG. 8 may be outputted to the transfer gate circuit 1300 as the back bias voltage of the transistor 1301. Therefore, the temperature influence on the word line circuit 1301 can be effectively reduced. However, the voltage change mechanism and related technical effect of the transfer gate circuit 1300 of this embodiment can be taught or obtained with reference to the foregoing embodiments of FIG. 11 to FIG. 12D, which are not repeated hereinafter.

In summary, the semiconductor memory with temperature dependence of the disclosure can utilize the temperature sensor disposed in the semiconductor memory to obtain the current temperature information, and adjusts the charge-pump output voltage based on the current temperature information, so as to effectively and timely reduce the temperature influences on the semiconductor memory.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor memory with temperature dependence, comprising:
   a memory array;
   a temperature sensor circuit, configured to provide a temperature dependent signal; and
   a pump circuit, coupled to the temperature sensor circuit and the memory array, and configured to output a charge-pump output voltage to the memory array according to the temperature dependent signal,
   wherein the charge-pump output voltage depends on the temperature dependent signal, wherein the pump circuit comprises:
a voltage comparator circuit, coupled to the temperature sensor circuit, and configured to receive a reference voltage and the charge-pump output voltage; and
a charge pump, coupled to the voltage comparator circuit,
wherein the voltage comparator circuit outputs a pump activation signal to the charge pump according to the reference voltage and a feedback voltage corresponding to the charge-pump output voltage, and the charge pump outputs the charge-pump output voltage according to the pump activation signal,
wherein the reference voltage or the feedback voltage depends on the temperature dependent signal,
wherein the voltage comparator circuit comprises:
a first resistor, wherein a first terminal of the first resistor is coupled to the charge-pump output voltage, a second terminal of the first resistor is coupled to a circuit node;
a second resistor, wherein a first terminal of the second resistor is coupled to the circuit node, and a second terminal of the second resistor is coupled to a ground voltage; and
a first comparator, wherein a first input terminal of the first comparator coupled to the circuit node to receive the feedback voltage, a second input terminal of the first comparator receives the reference voltage, and an output terminal of the first comparator outputs the pump activation signal,
wherein the temperature sensor circuit comprises:
a temperature sensor, configured to output a logic signal; and
a voltage selector, coupled to the temperature sensor and the second input terminal of the first comparator, and configured to receive the logic signal; and
a divided resistor, coupled to the voltage selector, and configured to generate a plurality of divided voltages according to a high voltage level and a low voltage level,
wherein the voltage selector generates the reference voltage as the temperature dependent signal to the first comparator according to the plurality of divided voltages and the logic signal.

2. The semiconductor memory according to the claim 1, wherein the temperature sensor determines that a temperature sensing voltage is locate between two of a plurality of threshold voltages to output the logic signal with a specific logic code sequence.

3. The semiconductor memory according to the claim 2, wherein the temperature sensing voltage is negatively related with a temperature sensing by the temperature sensor circuit.

4. The semiconductor memory according to the claim 1, wherein the charge-pump output voltage is negatively related with a temperature sensing by the temperature sensor circuit.

5. The semiconductor memory according to the claim 1, wherein the pump circuit outputs the charge-pump output voltage to the memory array as a memory control voltage.

6. The semiconductor memory according to the claim 1, wherein the pump circuit outputs the charge-pump output voltage to a sense amplifier of the memory array as a control signal voltage of a transistor in the sense amplifier.

7. The semiconductor memory according to the claim 1, wherein the pump circuit outputs the charge-pump output voltage to a sense amplifier of the memory array as a back bias voltage of a transistor in the sense amplifier.

8. The semiconductor memory according to the claim 1, wherein the pump circuit outputs the charge-pump output voltage to an equalize control circuit of the memory array as an equalize voltage or a back bias voltage of a transistor in the equalize control circuit.

9. The semiconductor memory according to the claim 1, wherein the pump circuit outputs the charge-pump output voltage to an equalize control circuit of the memory array as a back bias voltage of a transistor in the equalize control circuit.

10. The semiconductor memory according to the claim 1, wherein the pump circuit outputs the charge-pump output voltage to a memory cell of the memory array as a word line voltage of a word line.

11. The semiconductor memory according to the claim 1, wherein the pump circuit outputs the charge-pump output voltage to a memory cell of the memory array as a back bias voltage of a transistor coupled to a word line.

12. The semiconductor memory according to the claim 1, wherein the pump circuit outputs the charge-pump output voltage to the memory array as a transfer voltage of a data bus.

13. The semiconductor memory according to the claim 1, wherein the pump circuit outputs the charge-pump output voltage to the memory array as a back bias voltage of a transistor coupled to a data bus.

14. A semiconductor memory with temperature dependence, comprising:
a memory array;
a temperature sensor circuit, configured to provide a temperature dependent signal; and
a pump circuit, coupled to the temperature sensor circuit and the memory array, and configured to output a charge-pump output voltage to the memory array according to the temperature dependent signal,
wherein the charge-pump output voltage depends on the temperature dependent signal,
wherein the pump circuit comprises:
a voltage comparator circuit, coupled to the temperature sensor circuit, and configured to receive a reference voltage and the charge-pump output voltage; and
a charge pump, coupled to the voltage comparator circuit,
wherein the voltage comparator circuit outputs a pump activation signal to the charge pump according to the reference voltage and a feedback voltage corresponding to the charge-pump output voltage, and the charge pump outputs the charge-pump output voltage according to the pump activation signal,
wherein the reference voltage or the feedback voltage depends on the temperature dependent signal,
wherein the voltage comparator circuit comprises:
a first resistor, wherein a first terminal of the first resistor is coupled to the charge-pump output voltage, a second terminal of the first resistor is coupled to a circuit node;
a second resistor, wherein a first terminal of the second resistor is coupled to the circuit node, and a second terminal of the second resistor is coupled to a ground voltage; and
a first comparator, wherein a first input terminal of the first comparator is coupled to the circuit node to receive the feedback voltage, a second input terminal of the first comparator receives the reference voltage, and an output terminal of the first comparator outputs the pump activation signal,
wherein the temperature sensor circuit comprises:
a temperature sensor, coupled to the second input terminal of the first comparator, and configured to provide an analog signal as the reference voltage, wherein the temperature sensor comprises:
a second comparator, wherein a first input terminal of the second comparator is coupled to a constant voltage;
a third resistor, wherein a first terminal of the third resistor is coupled to a temperature sensing voltage, and a second terminal of the third resistor is coupled to a second input terminal of the second comparator; and
a fourth resistor, wherein a first terminal of the fourth resistor is coupled to the second input terminal of the second comparator, and a second terminal of the fourth resistor is coupled to an output terminal of the second comparator,
wherein the output terminal of the second comparator outputs the analog signal.

15. The semiconductor memory according to the claim 14, wherein the temperature sensing voltage is negatively related with a temperature sensed by the temperature sensor.

16. A semiconductor memory with temperature dependence, comprising:
a memory array;
a temperature sensor circuit, configured to provide a temperature dependent signal; and
a pump circuit, coupled to the temperature sensor circuit and the memory array, and configured to output a charge-pump output voltage to the memory array according to the temperature dependent signal,
wherein the charge-pump output voltage depends on the temperature dependent signal,
wherein the pump circuit comprises:
a voltage comparator circuit, coupled to the temperature sensor circuit, and configured to receive a reference voltage and the charge-pump output voltage; and
a charge pump, coupled to the voltage comparator circuit,
wherein the voltage comparator circuit outputs a pump activation signal to the charge pump according to the reference voltage and a feedback voltage corresponding to the charge-pump output voltage, and the charge pump outputs the charge-pump output voltage according to the pump activation signal,
wherein the reference voltage or the feedback voltage depends on the temperature dependent signal,
wherein the voltage comparator circuit comprises:
a first resistor, wherein a first terminal of the first resistor is coupled to the charge-pump output voltage, a second terminal of the first resistor is coupled to a circuit node;
a second resistor, wherein a first terminal of the second resistor is coupled to the circuit node, and a second terminal of the second resistor is coupled to a ground voltage; and
a first comparator, wherein a first input terminal of the first comparator is coupled to the circuit node to receive the feedback voltage, a second input terminal of the first comparator receives the reference voltage, and an output terminal of the first comparator outputs the pump activation signal,
wherein the first resistor and the second resistor are variable resistor, and the temperature sensor circuit comprises:
a temperature sensor, coupled to the first resistor and the second resistor, configured to output a logic signal as the temperature dependent signal to adjust a first resistance value of the first resistor and a second resistance value of the second resistor, so as to correspondingly adjust the feedback voltage.

17. The semiconductor memory according to the claim 16, wherein the temperature sensor determines that a temperature sensing voltage is locate between two of a plurality of threshold voltages to output the logic signal with a specific logic code sequence.

18. The semiconductor memory according to the claim 17, wherein the temperature sensing voltage is negatively related with a temperature sensing by the temperature sensor circuit.

* * * * *